(12) United States Patent
Liaw

(10) Patent No.: US 10,090,325 B1
(45) Date of Patent: Oct. 2, 2018

(54) CIRCUIT CELLS HAVING SEPARATED GATE ELECTRODES

(71) Applicant: TAIWAN SEMICONDUCTOR MANUFACTURING CO., LTD., Hsinchu (TW)

(72) Inventor: Jhon-Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/475,391

(22) Filed: Mar. 31, 2017

(51) Int. Cl.
*H01L 27/118* (2006.01)
*H01L 27/02* (2006.01)
*H01L 21/8234* (2006.01)
*H01L 21/8238* (2006.01)

(52) U.S. Cl.
CPC ......... *H01L 27/11807* (2013.01); *H01L 21/823431* (2013.01); *H01L 21/823437* (2013.01); *H01L 21/823475* (2013.01); *H01L 21/823821* (2013.01); *H01L 21/823828* (2013.01); *H01L 21/823871* (2013.01); *H01L 27/0207* (2013.01); *H01L 2027/11831* (2013.01); *H01L 2027/11855* (2013.01); *H01L 2027/11866* (2013.01)

(58) Field of Classification Search
CPC ....... H01L 27/11807; H01L 21/823431; H01L 21/823437; H01L 21/823475

USPC .......... 257/202, 204, 206, 207, 208
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2015/0261894 A1* | 9/2015 | Kawa | H01L 27/0207 716/104 |

* cited by examiner

*Primary Examiner* — Tan N Tran
(74) *Attorney, Agent, or Firm* — McClure, Qualey & Rodack, LLP

(57) ABSTRACT

A device includes first circuit cells. Each of the first circuit cells includes isolation transistors, a first type transistor, a second type transistor, and a first gate contact. The isolation transistors are arranged adjacent to another one circuit cell of the plurality of first circuit cells. The first type transistor includes a first gate electrode. The second type transistor includes a second gate electrode, in which the second gate electrode is disposed with respect to the first gate electrode. The first gate contact is coupled between the first gate electrode and the second gate electrode.

20 Claims, 7 Drawing Sheets

CIRCUIT CELLS HAVING SEPARATED GATE ELECTRODES

BACKGROUND

One of the goals of the semiconductor industry is to continue shrinking the size and increasing the speed of individual field-effect transistors (FETs), which include, for example, metal oxide semiconductor (MOS) transistors. To achieve these goals, fin FETs (FinFETs) or multiple gate transistors are developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
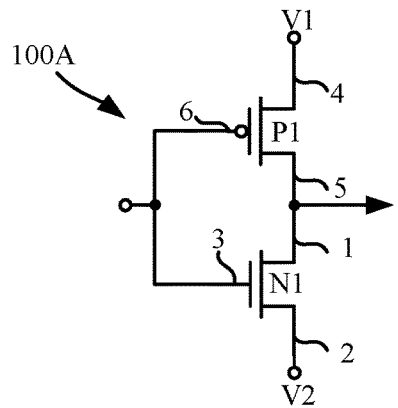
FIG. 1 is a schematic diagram of an electronic device, in accordance with some embodiments of the present disclosure.
Figure 1:
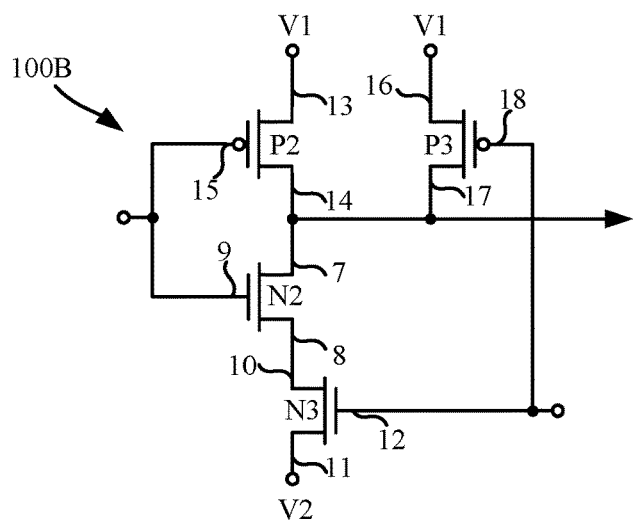
Figure 1:
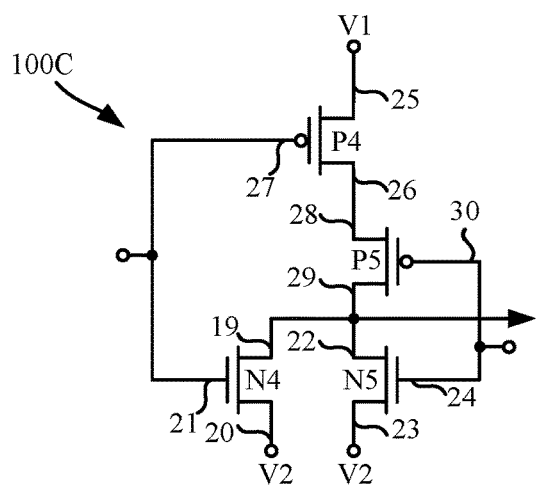

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Reference is now made to FIG. 1. FIG. 1 is a schematic diagram of an electronic device, in accordance with some embodiments of the present disclosure. In some embodiments, the electronic device in FIG. 1 includes circuit cells 100. In some embodiments, the circuit cells 100 are referred to as "standard cells." In some embodiments, the standard cells are laid out and stored in a circuit library. On condition that an integrated circuit is designed, one or more standard cells are retrieved from the circuit library to be placed and routed to form the integrated circuit. In some embodiments, the placement and the routing processes are performed by at least one design tool. In some embodiments, the standard cells are configured to perform basic logical operations which include, for example, an NAND operation, an NOR operation, or an NOT operation. The above basic logical operations are given for illustrative purposes only. Various basic logical operations that are able to be performed by the standard cells are within the contemplated scope of the present disclosure.

As illustratively shown in FIG. 1, in some embodiments, the circuit cells 100 includes an inverter 100A, an NAND gate 100B, and an NOR gate 100C. The inverter 100A is configured to perform the NOT operation. In some embodiments, each of the inverter 100A, the NAND gate 100B, and NOR gate 100C is implemented with at least one pair of complementary metal-oxide-semiconductor field-effect transistors (CMOS). Taking the inverter 100A as an example, the inverter 100A includes a first-type transistor N1 and a second-type transistor P1. The first-type transistor N1 includes source/drain (S/D) terminals 1-2 and a gate terminal 3, and the second-type transistor P1 includes source/drain (S/D) terminals 4-5 and a gate terminal 6.

In some embodiments, the gate terminals 3 and 6 are coupled to each other, in order to operate as an input terminal of the inverter 100A. In some embodiments, the S/D terminals 1 and 5 are coupled with each other, in order to operate as an output terminal of the inverter 100A. In some embodiments, the S/D terminal 4 is configured to receive a first predetermined voltage V1 (e.g., VDD). In some embodiments, the S/D terminal 2 is configured to receive a second predetermined voltage V2 (e.g., VSS or a ground voltage) lower than the first predetermined voltage V1.

The NAND gate 100B is configured to perform the NAND operation. In some embodiments, the NAND gate 100B includes first-type transistors N2 and N3 and second-type transistors P2 and P3. The first-type transistor N2 includes S/D terminals 7-8 and a gate terminal 9, and the first-type transistor N3 includes S/D terminals 10-11 and a gate terminal 12. The second-type transistor P2 includes S/D terminals 13-14 and a gate terminal 15, and the second-type transistor P3 includes S/D terminals 16-17 and a gate terminal 18.

In some embodiments, the gate terminals 9 and 15 are coupled to each other, in order to operate as a first input terminal of the NAND gate 100B, and the gate terminals 12 and 18 are coupled to each other, in order to operate as a second input terminal of the NAND gate 100B. In some embodiments, the S/D terminals 7, 14, and 17 are coupled with each other, in order to operate as an output terminal of the NAND gate 100B. In some embodiments, the arrangements of S/D terminals 7, 14, and 17 are referred to as "common source/drain." In some embodiments, the S/D terminal 13 and 16 are configured to receive the first predetermined voltage V1. In some embodiments, the S/D terminal 11 is configured to receive the second predetermined voltage V2. The S/D terminals 8 and 10 are coupled to each other, and also form the arrangement of "common source/drain."

The NOR gate 100C is configured to perform the NOR operation. In some embodiments, the NOR gate 100C includes first-type transistors N4 and N5 and second-type transistors P4 and P5. The first-type transistor N4 includes S/D terminals 19-20 and a gate terminal 21, and the first-type transistor N5 includes S/D terminals 22-23 and a gate terminal 24. The second-type transistor P4 includes S/D terminals 25-26 and a gate terminal 27, and the second-type transistor P5 includes S/D terminals 28-29 and a gate terminal 30.

In some embodiments, the gate terminals 21 and 27 are coupled to each other, in order to operate as a first input terminal of the NOR gate 100C, and the gate terminals 24 and 30 are coupled to each other, in order to operate as a second input terminal of the NOR gate 100C. In some embodiments, the S/D terminals 19, 22, and 29 are coupled with each other, in order to operate as an output terminal of the NOR gate 100C. In some embodiments, the connection between S/D terminals 19, 22, and 29 form the arrangement of "common source/drain." In some embodiments, the S/D terminal 25 is configured to receive the first predetermined voltage V1. In some embodiments, the S/D terminals 20 and 23 are configured to receive the second predetermined voltage V2. The S/D terminals 26 and 28 are coupled to each other, and also form the arrangement of "common source/drain." In some embodiments, the first-type transistors N1-N5 are N-type transistors, and the second-type transistors P1-P5 are P-type transistors.

The implementations of circuit cells 100 are given for illustrative purposes only. Various implementations of the circuit cells 100 are within the contemplated scope of the present disclosure.

Figure 2:
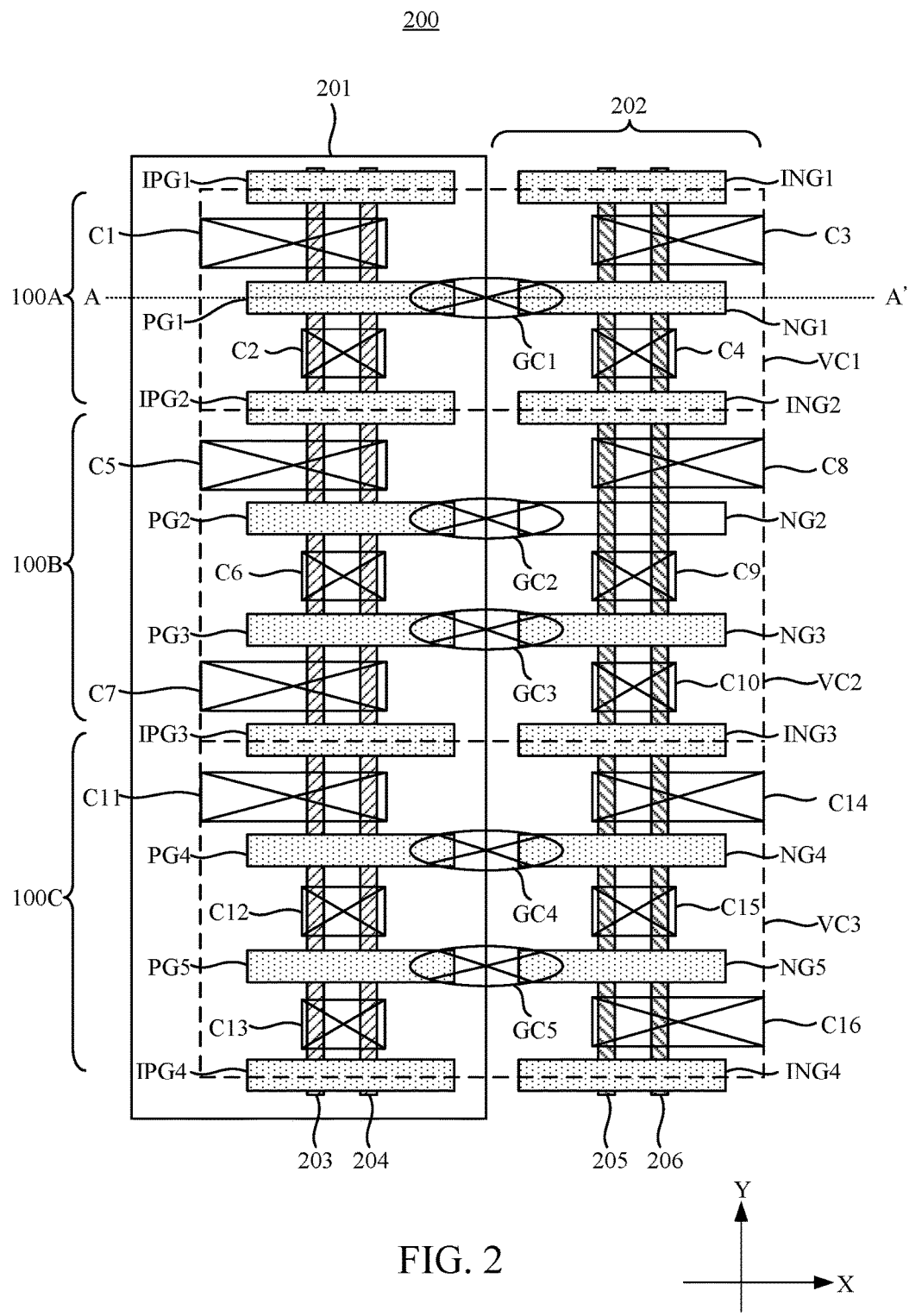
FIG. 2 is a schematic diagram of a top view of a layout corresponding to the circuit cells in FIG. 1, in accordance with some embodiments of the present disclosure.

Reference is now made to FIG. 2. FIG. 2 is a schematic diagram of a top view of a layout 200 corresponding to the circuit cells 100 in FIG. 1, in accordance with some embodiments of the present disclosure. For ease of understanding, like elements in FIG. 2 are designated with the same reference number with respect to FIG. 1.

In some embodiments, the circuit cells 100 in FIG. 1 are implemented with fin field-effect transistors (FINFET). As illustratively shown in FIG. 2, the layout 200 includes an N-type well region 201, a P-type well region 202, fin 203-206, gate electrodes PG1-PG5, NG1-NG5, IPG1-IPG4, and ING1-ING4, gate contacts GC1-GC5, and contacts C1-C16.

In some embodiments, the N-type well region 201 and the P-type well region 202 are formed on a substrate (not shown) and are spaced apart. The N-type well region 201 and the P-type well region 202 are disposed in X-direction and elongated in Y-direction, in order to form the second-type transistors P1-P5 and the first-type transistors N1-N5, respectively.

The fins 203 and 204 are arranged in parallel with each other and spaced apart. The fins 203 and 204 are formed on the N-type well region 201 and elongated in Y-direction. In some embodiments, the fins 203 and 204 are arranged to operate as S/D regions of the second-type transistors P1-P5 in FIG. 1. For illustration, portions of the fins 203 and 204 extend from the gate electrode PG1 to the gate electrode IPG1 are arranged as an S/D region of the second-type transistor P1, and correspond to the S/D terminal 4 in FIG. 1. Portions of the fins 203 and 204 extend from the gate electrode PG1 to the gate electrode IPG2 are arranged as an S/D region of the second-type transistor P1, and correspond to the S/D terminal 5 in FIG. 1. With the same analogy, the arrangements of portions of the fins 203-204, which correspond to the S/D terminals of the second-type transistors P2-P5 in FIG. 1, can be understood with reference to FIGS. 1 and 2.

In some embodiments, the fins 203 and 204 are formed with SiGe. In some embodiments, an atomic concentration of Ge in the fin 203 or 204 is in a range of about 10%-40%. The materials and the related ratio are given for illustrative purposes only. Various materials and values of the related ratio to implement the fins 203 and 204 are within the contemplated scope of the present disclosure.

In some embodiments, the fins 205 and 206 are arranged in parallel with each other and spaced apart. The fins 205 and 206 are formed on the P-type well region 202, in order to operate as S/D regions of the first-type transistors N1-N5 in FIG. 1. For illustration, portions of the fins 205 and 206 extend from the gate electrode NG1 to the gate electrode ING1 are arranged as an S/D region of the first-type transistor N1, and correspond to the S/D terminal 2 in FIG. 1. Portions of the fins 205 and 206 extend from the gate electrode NG1 to the gate electrode ING2 are arranged as an S/D region of the first-type transistor N1, and correspond to the S/D terminal 1 in FIG. 1. With the same analogy, the arrangements of portions of the fins 205-206, which correspond to the S/D terminals of the second-type transistors N2-N5 in FIG. 1, can be understood with reference to FIGS. 1 and 2.

In some embodiments, the fins 205 and 206 are formed with Si-based materials. In some embodiments, the Si-based materials include SiP, SiC, SiPC, SiAs, Si, or a combination thereof. The materials above are given for illustrative purposes only. Various materials to implement the fins 205 and 206 are within the contemplated scope of the present disclosure.

The contacts C1-C16 are formed at the S/D regions of the first-type transistors N1-N15 and the second-type transistors P1-P5, in order to form electrical connections among the transistors N1-N5 and P1-P5 in FIG. 1. For illustration, the contact C1 is formed at the portions of the fins 203 and 204 extending from the gate electrode PG1 to the gate electrode IPG1. The contact C2 is formed at the portions of the fins 203 and 204 extending from the gate electrode PG1 to the gate electrode IPG2. The contact C3 is formed at the portions of the fins 205 and 206 extending from the gate electrode NG1 to the gate electrode ING1. The contact C4 is formed in the portions of the fins 205 and 206 extending from the gate electrode NG1 to the gate electrode ING2. With the same analogy, the rest contacts C3-C16 are formed at locations corresponding to the S/D terminals 2, 1, 13, 14 (and/or 17), 16, 7, 8 (and/or 10), 11, 25, 26 (and/or 28), 29, 20, 19 (and/or 22), and 23, respectively.

In some embodiments, the contacts C1-C16 are formed by filling a conductive material in openings at corresponding locations of the S/D regions. In some embodiments, the contacts are arranged to provide electrical connections for the transistors N1-N5 or P1-P5. For example, the contacts C2 and C4 are further coupled to at least one conductive segment (not shown), in order to operate as the output terminal of the inverter 100A in FIG. 1. In some embodiments, the arrangements of the at least one conductive segment with the contacts C2 and C4 are set by the routing process. The above formation of the contacts is given for illustrative purposes only. Various processes to form the contacts are within the contemplated scope of the present disclosure.

The gate electrodes PG1-PG5 are formed on the N-type well region 201 and are arranged in parallel with each other. In some embodiments, the gate electrodes PG1-PG5 are formed over the fins 203 and 204. In some embodiments, the gate electrodes PG1-PG5 intersect the fins 203 and 204. In some embodiments, the gates electrodes PG1-PG5 are formed to wrap around a thin-vertical structure of the fins 203 and 204. In some embodiments, the gates electrodes PG1-PG5 correspond to the gate terminals 6, 15, 18, 27, and 30 in FIG. 1, respectively.

The gate electrodes NG1-NG5 are formed on the P-type well region 202 and are arranged in parallel with each other. In some embodiments, the gate electrodes NG1-NG5 are formed over the fins 205 and 206. In some embodiments, the gate electrodes NG1-NG5 intersect the fins 205 and 206. In some embodiments, the gates electrodes NG1-NG5 are formed to wrap around a thin-vertical structure of the fins 205 and 206. In some embodiments, the gates electrodes NG1-NG5 correspond to the gate terminals 3, 9, 12, 21, and 24, respectively.

In some embodiments, the gate electrodes NG1-NG5 are disposed with respect to the gate electrodes PG1-PG5, respectively. In some embodiments, the gate electrodes NG1-NG5 and/or the gate electrodes PG1-PG5 are spaced apart. The gate electrode NG1 is disposed with respect to the gate electrode PG1, such that the gate electrodes NG1 and PG1 are aligned with each other. Accordingly, the gate electrodes NG1 and PG1 are able to be formed with the same mask. Moreover, a predetermined distance is present between the gate electrodes NG1 and PG1. Effectively, the gate electrodes NG1 and PG1 are physically separated from each other. In some embodiments, the predetermined distance is formed according to a mask corresponding to a "gate cut layer" as discussed in FIG. 6 below. In some embodiments, the arrangements between the gate electrodes PG1 and NG1, as discussed above, are also applied to the gates electrodes PG2-PG5 and NG2-NG5.

In some embodiments, gate electrodes, which correspond to an input terminal of the circuit cell in FIG. 1, of the gate electrodes NG1-NG5 and PG1-PG5 are coupled to each other by a corresponding gate contact. For illustration, the gate electrode NG1 corresponds to the gate terminal 3 of the first-type transistor N1, and the gate electrode PG1 corresponds to the gate terminal 6 of the second-type transistor P1, in which the gate terminals 3 and 6 correspond to the input terminal of the inverter 100A. Thus, the gate contact GC1 is formed on the gate electrodes NG1 and PG1, in order to couple the gate electrodes NG1 and PG1 with each other. With the same analogy, the corresponding arrangements of the gate contacts GC2-GC5 can be understood with reference to FIGS. 1-2.

In some embodiments, each of the gate contacts GC1-GC5 has a length longer than that of a normal contact, and is thus referred to as "longer contact." In some embodiments, each of the gate contacts GC1-GC5 has a rectangle shape. In some embodiments, a ratio of the length to the width of each of the gate contacts GC1-GC5 is equal to or more than about two. In some embodiments, the gate contacts GC1-GC5 are formed by filling a conductive material in openings at corresponding locations of the corresponding gate electrodes PG1-PG5 and NG1-NG5. In some embodiments, the conductive material includes tungsten, aluminum, or copper. The formation of the gate contacts GC1-GC5 and the conductive material are given for illustrative purposes only. Various processes and materials to form the gate contacts GC1-GC5 are within the contemplated scope of the present disclosure.

As illustratively shown in FIG. 2, virtual cell boundaries VC1-VC3 are further shown in FIG. 2 with dashed lines for ease of understanding. In some embodiments, the term "virtual" indicates that there is no physical element or layer in the circuit cells in FIG. 1 corresponding to the cell boundaries VC1-VC3. The cell boundaries VC1-VC3 are given for distinguishing the circuit cells in FIG. 1. For illustration, the inverter 100A in FIG. 1 corresponds to elements located in the cell boundary VC1. The NAND gate 100B in FIG. 1 corresponds to elements located in the cell boundary VC2. The NOR gate 100C in FIG. 1 corresponds to elements located in the cell boundary VC3.

In some embodiments, each of the circuit cells in FIG. 2 includes at least one isolation transistor, and the at least one isolation transistor is arranged at an adjacent circuit cell. Taking the inverter 100A as an example, the gate electrodes ING1-ING2 and IPG1-IPG2 are located in the cell boundary C1. The gate electrodes ING1 and IPG1 are disposed with respect to each other, and the gate electrodes ING2 and IPG2 are disposed with respect to each other. The gate electrodes ING1-ING2 are formed on the P-type well region 202 and intersect the fins 205 and 206. Effectively, the gate electrodes ING1-ING2 and the adjacent portions of the fins 205 and 206 are arranged as N-type isolation transistors. The gate electrodes IPG1-IPG2 are formed on the N-type well region 201 and intersect the fins 203 and 204. Effectively, the gate electrodes IPG1-IPG2 and the adjacent portions of the fins 203 and 204 are arranged as P-type isolation transistors. With the same analogy, the arrangements of the rest gate electrodes ING3-ING4 and IPG3-IPG4 and the corresponding isolation transistors can be understood with reference to FIG. 2.

As illustratively shown in FIG. 2, the isolation transistors corresponding to the gate electrodes IPG2 and ING2 are included by the inverter 100A and the NAND gate 100B. The isolation transistors corresponding to the gate electrodes IPG3 and ING3 are included by the NAND gate 100B and the NOR gate 100C. In some embodiments, the isolation transistors are arranged to electrically isolate two corresponding circuit cells from each other. For illustration, the isolation transistors corresponding to the gate electrodes IPG2 and ING2 are disposed between the inverter 100A and the NANG gate 100B, in order to separate and isolated the inverter 100A and the NANG gate 100B from each other. In some embodiments, in order to provide better isolation, the gate electrodes IPG1-IPG4 are configured to receive the first predetermined voltage V1 (e.g., VDD) in FIG. 1, and the gate electrodes ING1-ING4 are configured to receive the second predetermined voltage V2 (e.g., VSS or ground voltage) in FIG. 2.

In some embodiments, the gate electrodes ING1-ING4 are disposed with respect to the gate electrodes IPG1-IPG4, respectively. Accordingly, the gate electrodes ING1-IG4 and IPG1-IPG4 are able to be formed with the same mask. Moreover, a predetermined distance is present between the gate electrodes ING1-IG4 and IPG1-IPG4. Effectively, the gate electrodes ING1-ING4 and IPG1-IPG4 are physically separated from each other. In some embodiments, the predetermined distance is formed according to a mask corresponding to the "gate cut layer" as discussed in FIG. 6 below.

In some approaches, gate electrodes corresponding to the gate terminals which are coupled together are directly formed by a one-piece gate electrode. For example, in these approaches, the gate electrode PG1 and NG1 in FIG. 2 may be formed with one gate electrode. Under this condition, non-regular patterns, which include, for example, the space between the gate electrode ING2 and IPG2 in FIG. 2, would be present. Accordingly, the uniformity and/or the matching of the gate electrodes are reduced. As a result, the performance of the circuit cells is reduced.

Compared with the approaches discussed above, in some embodiments, all of the gate electrodes in FIG. 2 are spaced apart by an area. In some embodiments, the area is able to be formed based on a layout pattern having a rectangle shape. Accordingly, the non-regular patterns are able to be omitted. As a result, the uniformity and/or the matching of the gate electrodes are improved.

A number of the circuit cells 100 shown in the layout 200 in FIG. 2 are given for illustrative purposes only. Various numbers of the circuit cells 100 included in the layout 200 are within the contemplated scope of the present disclosure. For example, in some other embodiments, the number of the circuit cells 100 included in the layout 200 is more than three, such that a routing length is set to across at least four circuit cells 100 that are abutted together.

Figure 3:
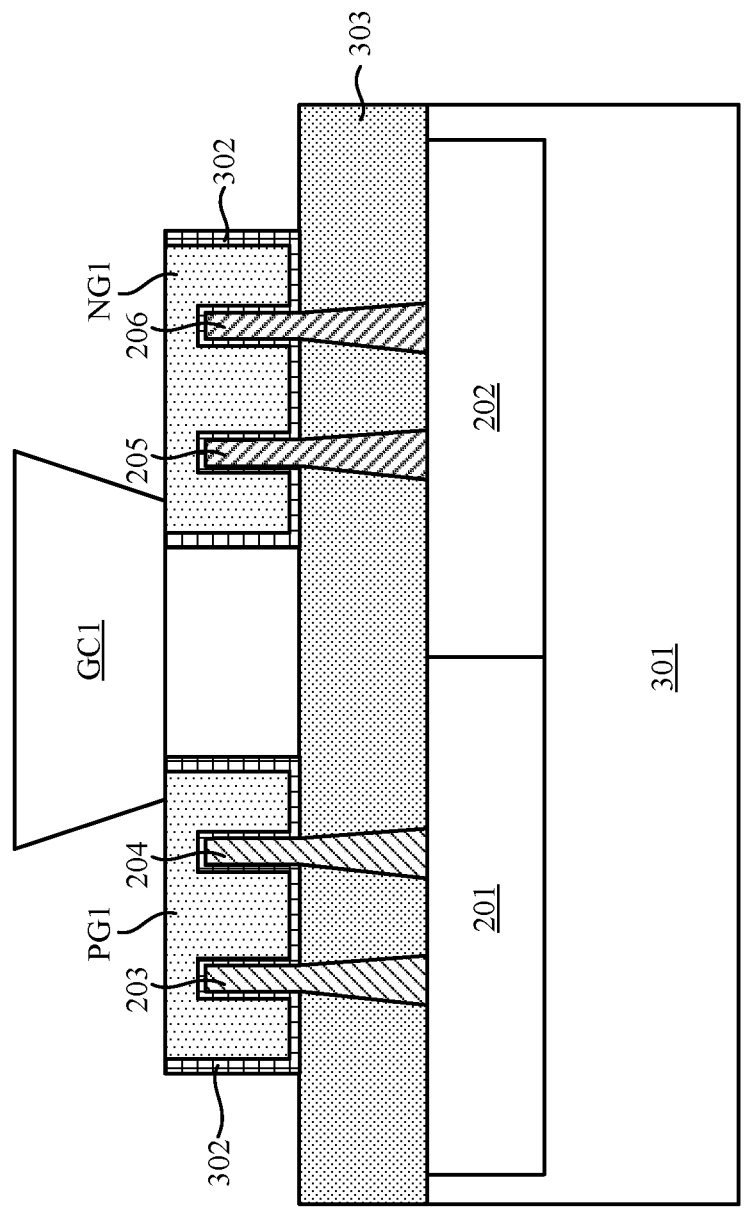
FIG. 3 is a schematic diagram illustrating a cross section associated with a line AA' in FIG. 2, in accordance with some embodiments of the present disclosure.

Reference is now made to FIG. 3. FIG. 3 is a schematic diagram illustrating a cross section associated with a line AA' in FIG. 2, in accordance with some embodiments of the present disclosure. For ease of understanding, like elements in FIG. 3 are designated with the same reference number with respect to FIG. 2.

As illustratively shown in FIG. 3, a semiconductor substrate 301 is provided. The N-type well region 201 and the P-type well region 202 are shown deposited on the substrate 301. The fins 203-206 may be formed, for example, by photolithographic pattern and etch processes to remove semiconductor material from the N-type well region 201 and the P-type well region 202. A gate dielectric 302 is formed on vertical sides and the top of the fins 203-206. The gate electrode PG1 is deposited over the fins 203-204 and the gate dielectric 302. Effectively, an active region is formed at the top surface and along the vertical sides of the fins 203-204. The gate electrode NG1 is deposited over the fins 205-206 and the gate dielectric 302. Effectively, an active region is formed at the top surface and along the vertical sides of the fins 205-206. The gate contact GC1 is formed on the gate electrodes PG1 and NG1, in order to couple these gate electrodes with each other. An isolation region 303 is formed to wrap around the fins 203-206, in order to protect the fins 203-206. In some embodiments, the isolation region 303 is implemented with shallow trench isolation (STI) structures.

In some embodiments, the gate electrodes PG1 and NG1 include metal gate material, the polysilicon, or a combination thereof. In some embodiments, the gate dielectric 302 includes an oxide, nitride, high-k or low-k material. The arrangements shown in FIG. 3 and the related materials are given for illustrative purposes only. Various arrangements and materials to implement the circuit cells in FIGS. 1-2 are within the contemplated scope of the present disclosure.

As discussed above, in some embodiments, the fins 203-204 are implemented with SiGe. Accordingly, a region under the top surface and side walls of the fins 203-204 is arranged as a SiGe channel region for the second-type transistor PG1. In some embodiments, the fins 205-206 are implemented with Si-based materials. Accordingly, a region under the top surface and side walls of the fins 205-206 is arranged as a Si-based channel region for the first-type transistor NG1.

The number of the fins 203-2206 shown in FIGS. 2-3 are given for illustrative purposes only. Various numbers of the fins 203-206 are within the contemplated scope of the present disclosure. For example, in some other embodiments, the first-type transistors NG1-NG5 and the second-type transistors PG1-PG5 are implemented with FINFETs having a single fin.

For illustrative purposes only, the circuit cells in FIGS. 1-2 are described with the inverter 100A, the NAND gate 100B, and the NOR gate 100C. Various circuit cells, suitable to operate as a standard cell, are within the contemplated scope of the present disclosure. For example, in some other embodiments, the circuit cells further include a flip-flop.

Figure 4A:
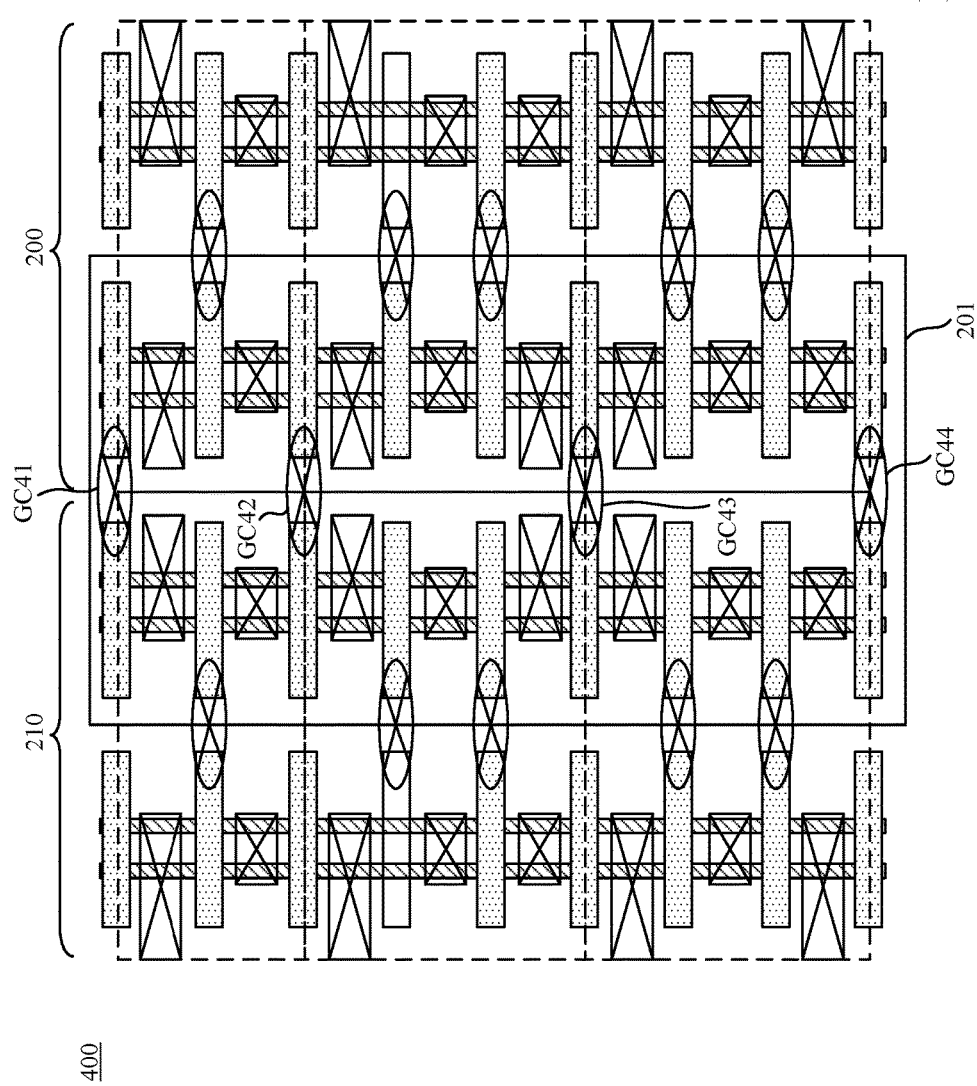
FIG. 4A is a top view of a layout of electronic device, in accordance with some embodiments of the present disclosure.

Reference is now made to FIG. 4A. FIG. 4A is a top view of a layout of electronic device 400, in accordance with some embodiments of the present disclosure. For ease of understanding, like elements in FIG. 4A are designated with the same reference number with respect to FIG. 2.

Compared with FIGS. 1-2, the electronic 400 further includes circuit cells that have a layout 210. The layout 210 has arrangements similar to the layout 200 of the circuit cells 100 discussed in FIGS. 1-2 above. Thus, the repetitious descriptions regarding the layout 210 are not further given herein. As illustratively shown in FIG. 4A, the circuit cells corresponding to the layout 200 and the circuit cells corresponding to the layout 210 are abutted with each other while the N-type well regions 201 thereof are combined. With such the arrangement, the circuit cells 100 and the circuit cells corresponding to the layout 210 are able to be highly integrated. As a result, the matching of the circuit cells in the electronic device 400 is improved.

In some embodiments, the electronic device 400 further includes gate contacts GC41-GC44. The gate contacts GC41-GC44 are formed on the gate electrodes of the P-type isolation transistors which are located in the common N-type well region 201. In some embodiments, the gate contacts GC41-GC44 are further coupled to conductive segments (not shown), in order to receive the first predetermined voltage V1 in FIG. 1. The arrangements of the gate contacts GC41-GC44 are similar to those of the gate contacts GC1-GC5 in FIG. 2. Thus, the repetitious descriptions regarding the gate contacts GC41-GC44 are not further given herein.

Figure 4B:
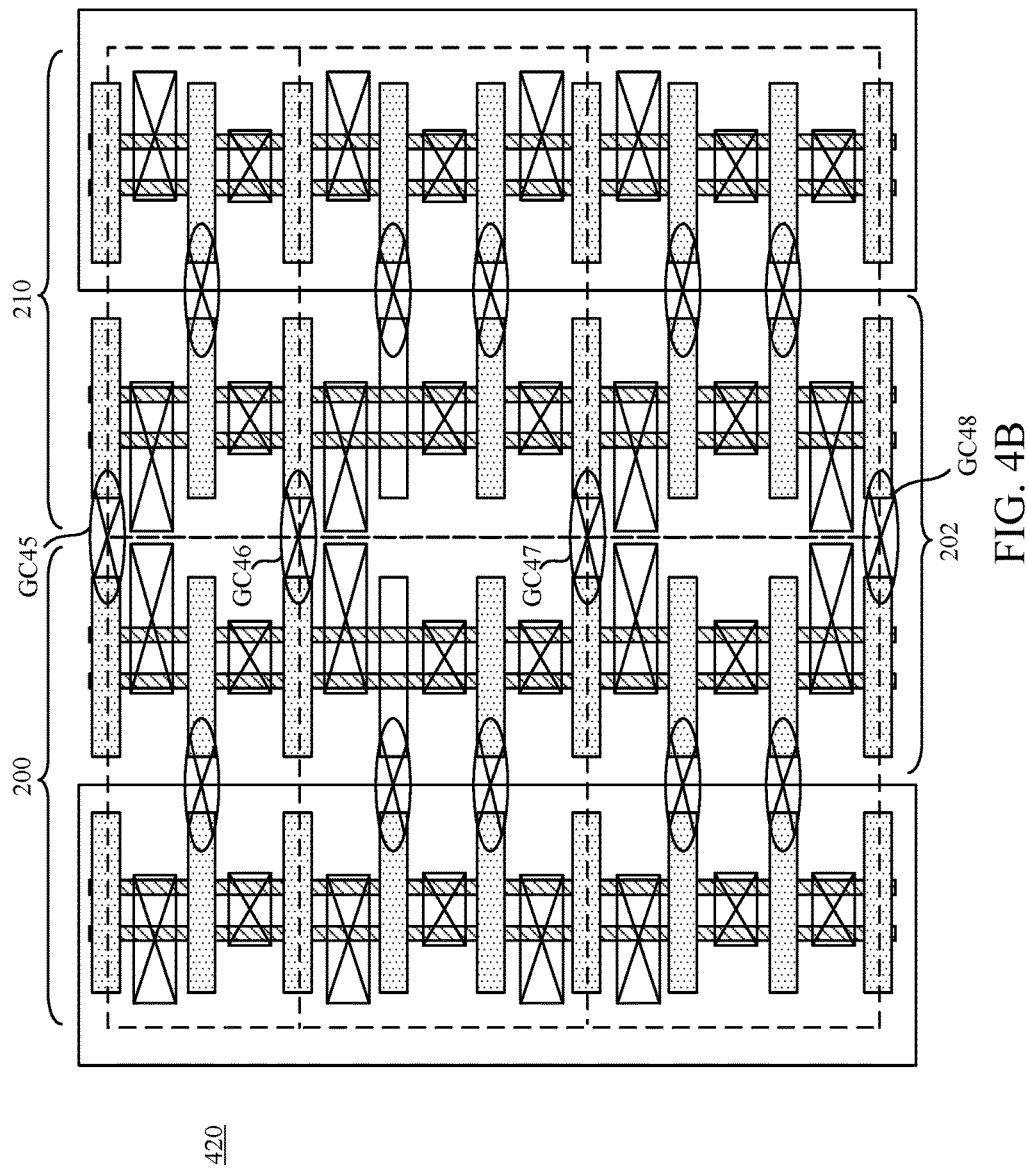
FIG. 4B is a top view of a layout of electronic device, in accordance with some embodiments of the present disclosure.

Reference is now made to FIG. 4B. FIG. 4B is a top view of a layout of electronic device 420, in accordance with some embodiments of the present disclosure. For ease of understanding, like elements in FIG. 4B are designated with the same reference number with respect to FIG. 4A.

Compared with FIG. 4A, the circuit cells corresponding to the layout 200 and the circuit cells corresponding to the layout 210 in FIG. 4B are abutted with each other while the P-type well regions 202 thereof are combined. In some embodiments, the electronic device 420 includes gate contacts GC45-GC48. The gate contacts GC45-GC48 are formed on the gate electrodes of the N-type isolation transistors which are located in the common P-type well region 200. In some embodiments, the gate conducts GC45-GC48 are further coupled to conductive segments (not shown), in order to receive the second predetermined voltage V2 in FIG. 1. The arrangements of the gate contacts GC45-GC48 are similar to those of the gate contacts GC1-GC5 in FIG. 2. Thus, the repetitious descriptions regarding the gate contacts GC45-GC48 are not further given herein.

Figure 5:
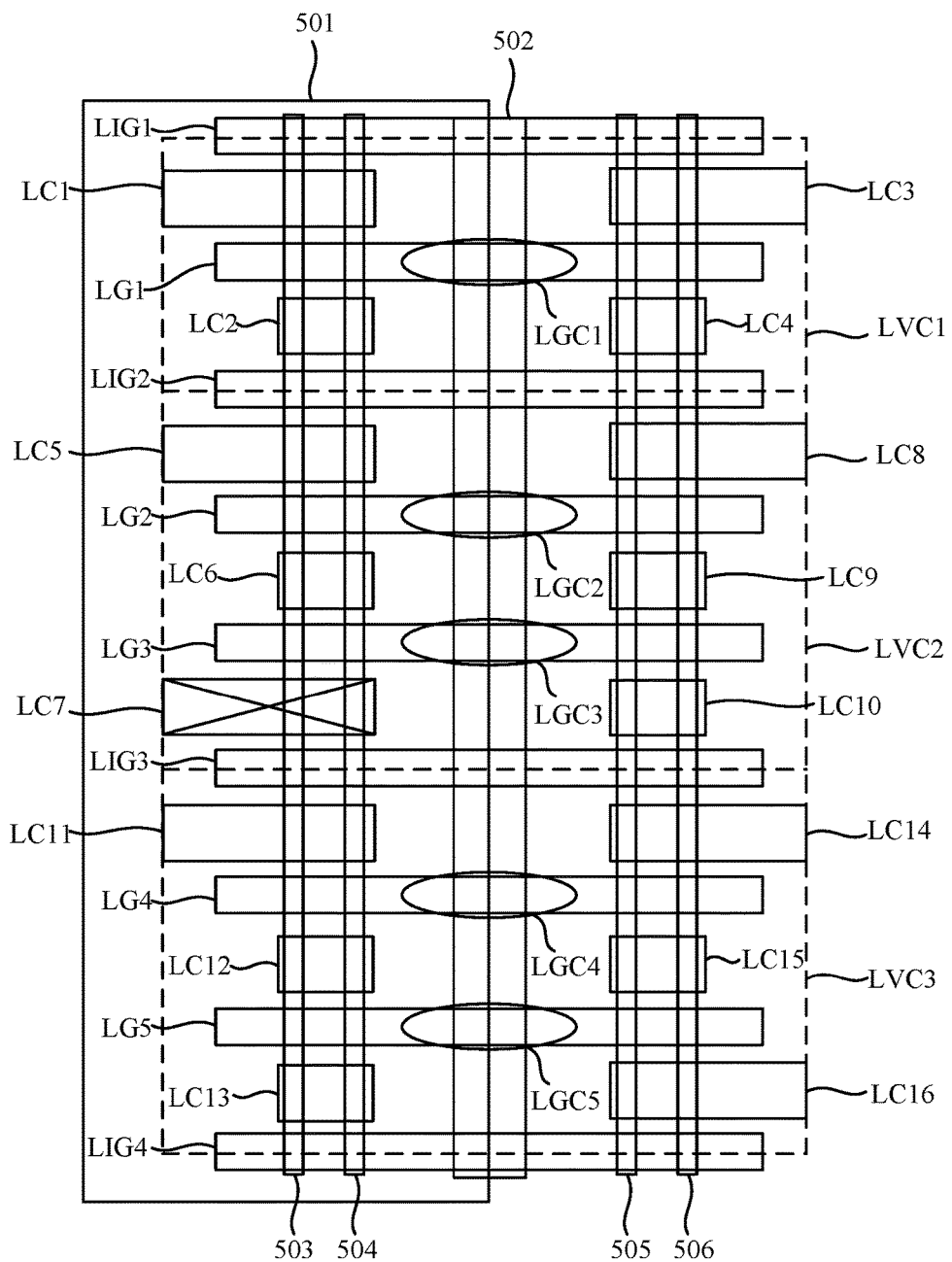
FIG. 5 is a schematic diagram illustrating a layout design corresponding to FIG. 2, in accordance with some embodiments of the present disclosure.
Figure 6:
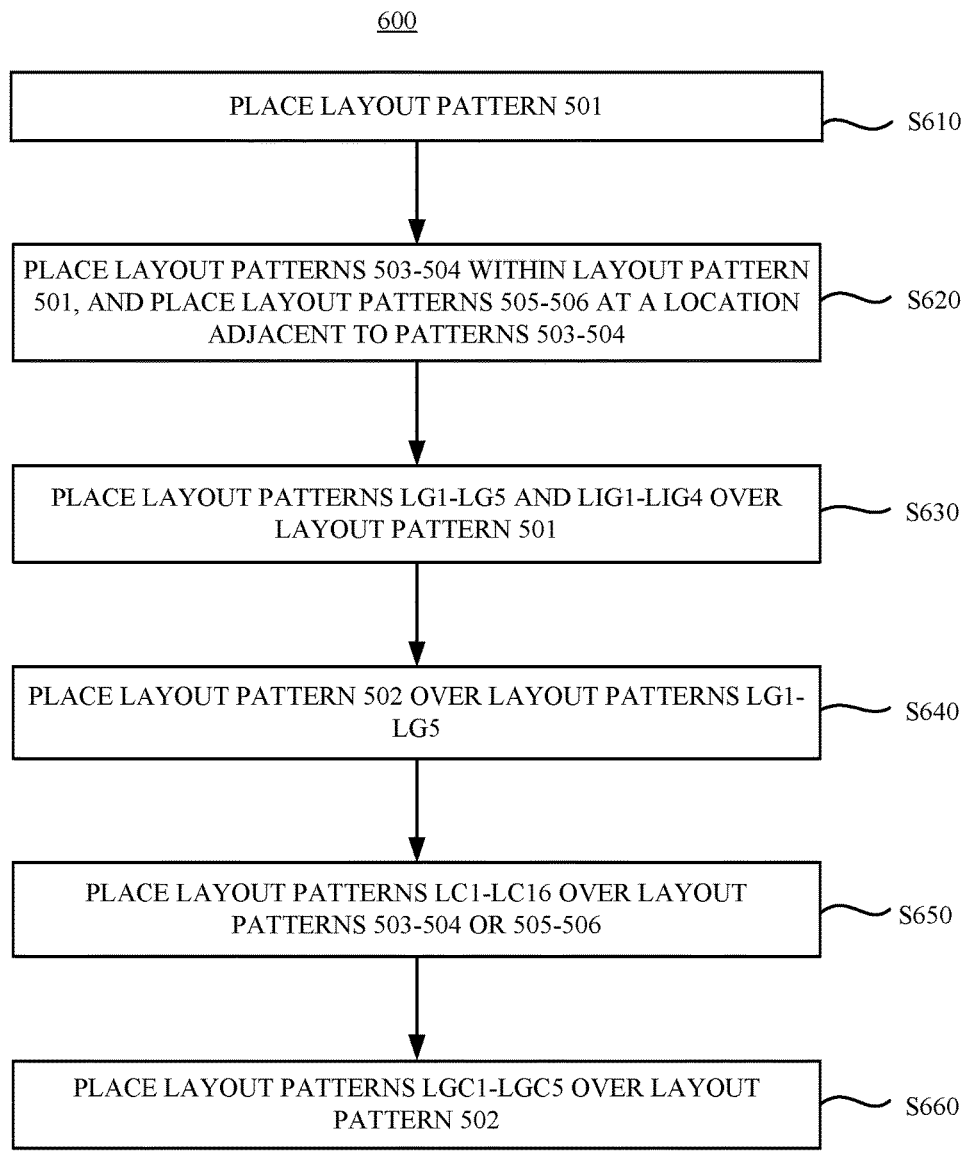
FIG. 6 is a flow chart of a method for arranging the layout design in FIG. 5, in accordance with some embodiments of the present disclosure

Reference is now made to both of FIG. 2, FIG. 5, and FIG. 6. FIG. 5 is a schematic diagram illustrating a layout design 500 corresponding to FIG. 2, in accordance with some embodiments of the present disclosure. FIG. 6 is a flow chart of a method 600 for arranging the layout design 500 in FIG. 5, in accordance with some embodiments of the present disclosure. As illustratively shown in FIG. 5, the layout design 500 includes layout patterns 501-506, LG1-LG5, LC1-LC16, LGC1-LGC5, and LVC1-LVC3.

For simplicity, the following descriptions are given with an example in which the circuit cells 100 in FIG. 1 are implemented according to the layout design 500 and the method 600. In some embodiments, the method 600 includes operations S610, S620, S630, S640, S650, and S660.

In operation S610, a layout pattern 501 is placed. In operation S620, layout patterns 503-504 are placed within the layout pattern 501, and layout patterns 505-506 are placed at a location adjacent to the patterns 503-504. For illustration, the layout pattern 501 corresponds to the well 110 in FIG. 1. The layout pattern 220 corresponds to the N-type well region 201 in FIG. 2. The layout patterns 503-506 correspond to the fins 203-205 in FIG. 2 respectively.

In operation S630, layout patterns LG1-LG5 and LIG1-LIG4 are placed over the layout pattern 501 and intersect the layout patterns 503-506. For illustration, the layout patterns LG1-LG5 correspond to the gate electrodes (PG1, NG1), (PG2, NG2), (PG3, NG3), (PG4, NG4), and (PG5, NG5), respectively. The layout patterns LG1-LG5 are placed to define the locations of these gate electrodes in FIG. 2 during the formation of the circuit cells 100. The layout patterns LIG1-LIG4 correspond to the gate electrodes (IPG1, ING1), (IPG2, ING2), (IPG3, ING3), and (IPG4, ING4), respectively. The layout patterns LIG1-LIG4 are placed to define the locations of these gate electrodes in FIG. 2 during the formation of the circuit cells 100.

In operation S640, a layout pattern 502 is placed over the layout patterns LG1-LG5, and in parallel with the layout patterns 503-506. As shown in FIG. 5, the layout pattern 502 is disposed at a location of a space between the gate electrodes PG1-PG5 and the gate electrode NG1-NG5 in FIG. 2. In some embodiments, the layout pattern 502 is referred to as a "gate cut layer." In some embodiments, the layout pattern 502 is arranged to define a regular area that is expected to be removed, in order to separate electrodes forming with the layout patterns LG1-LG5 to be the gate electrodes PG1-PG5 and the gate electrode NG1-NG5 in FIG. 2. With the arrangement of the layout patter 502 having a regular shape (e.g., a rectangle shape), the gate electrodes PG1-PG5 and NG1-NG5 are able to be formed with the same layout patterns, and the cutting area is designed to be rectangle. Accordingly, a critical dimension (CD) and the matching of the gate electrodes PG1-PG5 and NG1-NG5 are able to be improved.

In some embodiments, the regular area defined by the layout pattern 502 is removed by an etching process. The method to remove the regular area defined by the layout pattern 502 is given for illustrative purposes only. Various methods to remove the regular area defined by the layout pattern 502 are within the contemplated scope of the present disclosure.

In operation S650, the layout patterns LC1-LC16 are placed over the layout patterns 503-504 or 505-506. In operation S660, the layout patterns LGC1-LGC5 are placed over the layout pattern 502. For illustration, the layout patterns LC1-LC16 correspond to the contact C1-C16 in FIG. 2, respectively. The layout patterns LC1-LC16 are placed to define locations of the contact C1-C16, respectively. The layout patterns LGC1-LGC5 correspond to the gate contact GC1-GC5 in FIG. 2, respectively. The layout patterns LGC1-LGC5 are placed to define locations of the contact C1-C16, respectively, in order to form the gate contacts GC1-GC5 on the gate electrodes PG1-PG5 and NG1-NG5 after the regular area corresponding to the layout pattern 502 is removed.

In some further embodiments, the layout patterns LVC1-LVC3 are utilized to allow a layout designer and/or a design system to identify at which area that the circuit cells 100 in FIG. 1 are located in the layout design 500. The layout patterns LVC1-LVC3 correspond to the virtual cell boundaries VC1-VC3 in FIG. 2, respectively.

After operation S660 is performed, the layout design 500 in FIG. 5 is determined. In some embodiments, a wafer including the circuit cells 100 in FIG. 1 are able to be fabricated through one or more semiconductor manufacturing equipment according to data that indicates the layout design 500.

In some embodiments, the method 600 is implemented in a design tool carried in an electronic design automation (EDA) system. As such, the layout design 500 is able to be generated from the design tool with an auto place and route (APR) tool carried in the EDA system. In some other embodiments, the layout design 500 is manually designed by a layout designer through the design tool.

The above description of the method 600 includes exemplary operations, but the operations of the method 600 are not necessarily performed in the order described. The order of the operations of the method 600 disclosed in the present disclosure are able to be changed, or the operations are able to be executed simultaneously or partially simultaneously as appropriate, in accordance with the spirit and scope of various embodiments of the present disclosure.

As discussed above, the circuit cells and the method disclosed in the present disclosure utilize a regular layout pattern to form separated gate electrodes. As a result, a higher uniformity and matching for the circuit cells can be achieved.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a device includes first circuit cells. Each of the first circuit cells includes isolation transistors, a first type transistor, a second type transistor, and a first gate contact. The isolation transistors are arranged adjacent to another one circuit cell of the first circuit cells. The first type transistor includes a first gate electrode. The second type transistor includes a second gate electrode, in which the second gate electrode is disposed with respect to the first gate electrode. The first gate contact is coupled between the first gate electrode and the second gate electrode.

In some embodiments, a device includes first circuit cells. Each of the first circuit cells includes at least one pair of complementary transistors and a first gate contact. The at least one pair of complementary transistors includes a first gate electrode and a second gate electrode, in which a predetermined distance is present between the first gate electrode and the second gate electrode. The first gate contact coupled between the first gate electrode and the second gate electrode.

In some embodiments, a method includes following operations. First layout patterns corresponding to fins are placed. Second layout patterns are placed over the first layout patterns, in which the second layout patterns are placed to intersect the first layout patterns. A third layout pattern is placed between the second layout patterns, in which first portions, which are located at a first side of the third layout pattern, of the second layout patterns correspond to first gate electrodes of circuit cells, and second portions, which are located at a second side of the third layout pattern, of the second layout patterns correspond to second gate electrodes of the circuit cells. Fourth layout patterns are placed between and on the first portions of the second layout patterns and the second portions of the second layout patterns, in order to generate a layout design for fabricating the circuit cells, in which the fourth layout patterns correspond to gate contacts that couple the first gate electrodes with the second gate electrodes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a plurality of first circuit cells, wherein each of the plurality of first circuit cells comprises:
a first plurality of isolation transistors arranged to electrically isolate a present first circuit cell of the plurality of first circuit cells from another one first circuit cell of the plurality of first circuit cells;
a first type transistor comprising a first gate electrode;
a second type transistor comprising a second gate electrode; and
a first gate contact coupled between the first gate electrode and the second gate electrode.

2. The device of claim 1, wherein the first gate electrode and the second gate electrode are separated from each other.

3. The device of claim 1, wherein the first plurality of isolation transistors comprise a first isolation transistor comprising a third gate electrode, the third gate electrode is disposed in parallel with the first gate electrode, and the first isolation transistor and the first type transistor comprise a first source/drain region extending from the first gate electrode to the third gate electrode.

4. The device of claim 3, wherein the first plurality of isolation transistors further comprise a second isolation transistor comprising a fourth gate electrode, the fourth gate electrode is disposed with respect to the third gate electrode and in parallel with the second gate electrode, and the second isolation transistor and the second type transistor comprise a second source/drain region extending from the second gate electrode to the fourth gate electrode.

5. The device of claim 4, wherein the third gate electrode is configured to receive a first predetermined voltage, and the fourth gate electrode is configured to receive a second predetermined voltage lower than the first predetermined voltage.

6. The device of claim 4, wherein the first source/drain region and the second source/drain region are formed by portions of at least one fin.

7. The device of claim 4, wherein the third gate electrode and the fourth gate electrode are separated from each other.

8. The device of claim 1, wherein the plurality of first circuit cells are standard cells.

9. The device of claim 1, further comprising:
a plurality of second circuit cells abutted with the plurality of first circuit cells,
wherein the plurality of second circuit cells and the plurality of first circuit cells are formed on a same well region.

10. The device of claim 9, wherein the plurality of second circuit cells comprises a second plurality of isolation transistors, and the device further comprises:
a plurality of second gate contacts coupled between gate electrodes of transistors, which are formed on the same well region, of the plurality of second circuit cells and the plurality of first circuit cells.

11. A device, comprising:
a plurality of first circuit cells, wherein each of the plurality of first circuit cells comprises:
at least one pair of complementary transistors comprising a first gate electrode and a second gate electrode, wherein a predetermined distance is present between the first gate electrode and the second gate electrode;
a first gate contact coupled between the first gate electrode and the second gate electrode and;
at least one isolation transistor arranged to electrically isolate a present first circuit cell of the plurality of first circuit cells from an adjacent first circuit cell of the plurality of first circuit cells.

12. The device of claim 11, wherein the at least one isolation transistor comprises:
a plurality of isolation transistors arranged between the present first circuit cell and the adjacent first circuit cell of the plurality of first circuit cells.

13. The device of claim 12, wherein the plurality of isolation transistors comprise a first isolation transistor comprising a third gate electrode and a second isolation transistor comprising a fourth gate electrode disposed with respect to the third gate electrode, and the predetermined distance is present between the third gate electrode and the fourth gate electrode.

14. The device of claim 13, wherein the first isolation transistor and the at least one pair of complementary transistors comprise a source/drain region extending from the first gate electrode to the third gate.

15. The device of claim 13, wherein the second isolation transistor and the at least one pair of complementary transistors comprise a source/drain region extending from the second gate electrode to the fourth gate.

16. The device of claim 13, wherein the third gate electrode is configured to receive a first predetermined voltage, and the fourth gate electrode is configured to receive a second predetermined voltage lower than the first predetermined voltage.

17. The device of claim 11, wherein the at least one pair of complementary transistors are formed with fin field-effect transistors.

18. A device, comprising:
- a plurality of first circuit cells, wherein each of the plurality of first circuit cells comprises:
- at least two first transistors comprising gate electrodes that are separated from each other; and
- at least one first gate contact coupled between the gate electrodes of the at least two first transistors and;
- a plurality of isolation transistor arranged between a present first circuit cell and an adjacent first circuit cell of the plurality of first circuit cells to electrically isolate the present first circuit cell and the adjacent first circuit cell.

19. The device of claim 18, further comprising:
- a plurality of second circuit cells abutted with the plurality of first circuit cells, wherein each of the plurality of second circuit cells comprises:
- at least two second transistors comprising gate electrodes that are separated from each other; and
- at least one second gate contact coupled between the gate electrodes of the at least two second transistors;
- wherein the plurality of second circuit cells and the plurality of first circuit cells are formed on a same well region.

20. The device of claim 19, wherein the at least two first transistors and the at least two second transistors are formed with fin field-effect transistors.

\* \* \* \* \*